(12) United States Patent
Yen

(10) Patent No.: US 8,102,063 B2
(45) Date of Patent: Jan. 24, 2012

(54) PAD STRUCTURE WITH A NANO-STRUCTURED COATING FILM

(75) Inventor: Lee-Sheng Yen, Taoyuan County (TW)

(73) Assignee: Advance Materials Corporation, Luchu, Taoyuan (TW)

( * ) Notice: Subject to any disclaimer, the term of this patent is extended or adjusted under 35 U.S.C. 154(b) by 109 days.

(21) Appl. No.: 12/684,969

(22) Filed: Jan. 11, 2010

(65) Prior Publication Data

US 2011/0108876 A1    May 12, 2011

(30) Foreign Application Priority Data

Nov. 9, 2009   (TW) .............................. 98137910 A

(51) Int. Cl.
*H01L 23/48* (2006.01)
*H05K 1/09* (2006.01)

(52) U.S. Cl. .................... 257/786; 257/E21.59; 174/257
(58) Field of Classification Search .................. None
See application file for complete search history.

(56) References Cited

U.S. PATENT DOCUMENTS

| | | | |
|---|---|---|---|
| 7,393,771 B2 * | 7/2008 | Hozoji et al. | 438/610 |
| 2010/0044884 A1 * | 2/2010 | Zbrzezny et al. | 257/779 |
| 2010/0062597 A1 * | 3/2010 | Belanger et al. | 438/613 |
| 2010/0164079 A1 * | 7/2010 | Dekker et al. | 257/676 |
| 2011/0091697 A1 * | 4/2011 | Tseng et al. | 428/209 |

FOREIGN PATENT DOCUMENTS

KR    1020060089635 A    8/2006

* cited by examiner

*Primary Examiner* — Alonzo Chambliss
(74) *Attorney, Agent, or Firm* — Winston Hsu; Scott Margo

(57) ABSTRACT

A pad structure includes a copper circuit pattern on a substrate, at least a gold layer stacked on the copper circuit pattern, and a nano-structured coating film stacked on the gold layer.

27 Claims, 5 Drawing Sheets

PAD STRUCTURE WITH A NANO-STRUCTURED COATING FILM

BACKGROUND OF THE INVENTION

1. Field of the Invention

The present invention relates to a novel pad structure for electrical contact. More particularly, the present invention relates to an exposed contact pad/finger or a bond pad structure on a circuit board or package substrate, and fabrication methods thereof. The invention provides advantages including lower manufacturing cost and improved resistance to grinding, scratching or corrosion.

2. Description of the Prior Art

A circuit board or a package substrate is constructed with dense circuit patterns and intensive fine copper interconnecting traces that are electrically connected to a number of contact pads or bond pads distributed on the surface of the package substrate or circuit board for the transmission of electronic signals or power. On the top surface of the contact pads or bond pads such as wire-bond fingers or solder bond pads, a Ni/Au layer is typically formed to ensure that the these bond pads are in excellent electrical coupling with a circuit of a chip. Furthermore, the Ni/Au layer can prevent the contact pads or bond pads from oxidation thereby improving the electrical interconnection performance of the pads.

As known in the art, electroplating and chemical plating methods have long been used to form the Ni/Au layer on the contact pads or bond pads. Typically, the Ni/Au layer on the wire-bond fingers is formed by electroplating method. The gold layer formed by electroplating method is structurally dense and is able to prevent the underlying nickel layer from corrosion. In addition, the electroplated gold layer has better bondability. Nevertheless, a thicker gold layer, say 0.4-0.9 μm, is required when the gold layer is formed by electroplating method. Therefore the manufacturing cost is higher.

The Ni/Au layer on the surface mount device (SMD) is typically formed by chemical plating method and has a thickness of gold ranging between 0.1-0.2 μm, therefore, the manufacturing cost is lower. However, the so-called black pad problem occurs when using chemical plating method, which may cause poor bondability between the solder balls and the pads.

This industry has developed chemical plated Ni/Pd/Au layer to thereby broadly incorporate the Ni/Au layer formed by chemical plating method into the technology field of wire bonding. To improve the corrosion resistance of the chemical plated nickel layer, an intermediate palladium layer is plated on chemical plated nickel layer. However, the improvement of the corrosion resistance corrosion of the chemical plated nickel layer is not adequate. Besides, palladium is also expensive so the manufacturing cost is still high.

Further, it is known that the Ni/Au layer formed by the prior art methods has insufficient resistance to grinding or scratching. In some circumstances, it is also required that the above-mentioned the exposed wire-bond fingers or solder bond pads on the circuit board or package substrate should have better resistance to grinding or scratching in some circumstances in addition to corrosion resistance.

SUMMARY OF THE INVENTION

It is therefore the primary object of the present invention to provide an improved pad structure and a fabrication method thereof in order to solve the above-described prior art problems and shortcomings.

According to one preferred embodiment of the claimed invention, a pad structure includes a copper trace pattern on a substrate; a nickel layer stacked on the copper trace pattern; a gold layer stacked on the nickel layer; and a nano-structured coating film stacked on the gold layer.

According to another preferred embodiment of the claimed invention, a pad structure includes a copper trace pattern on a substrate; a gold layer stacked on the copper trace pattern; and a nano-structured coating film stacked on the gold layer.

According to yet another preferred embodiment of the claimed invention, a method for fabricating a pad structure includes providing a substrate; forming a copper trace pattern on the substrate; forming a nickel layer on the copper trace pattern; forming a gold layer on the nickel layer; and selectively depositing a nano-structured coating film on the gold layer.

According to still another preferred embodiment of the claimed invention, a pad structure includes a copper trace pattern on a substrate; a nickel layer stacked on the copper trace pattern; a silver layer stacked on the nickel layer; and a nano-structured coating film stacked on the silver layer. The substrate is a light-emitting diode (LED) package substrate.

The invention pad structure provides advantages including but not limited to lower manufacturing cost and improved resistance to grinding, scratching or corrosion. The invention pad structure is applicable to various technical fields such as wire bonding, flip-chip packaging or LED packaging.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
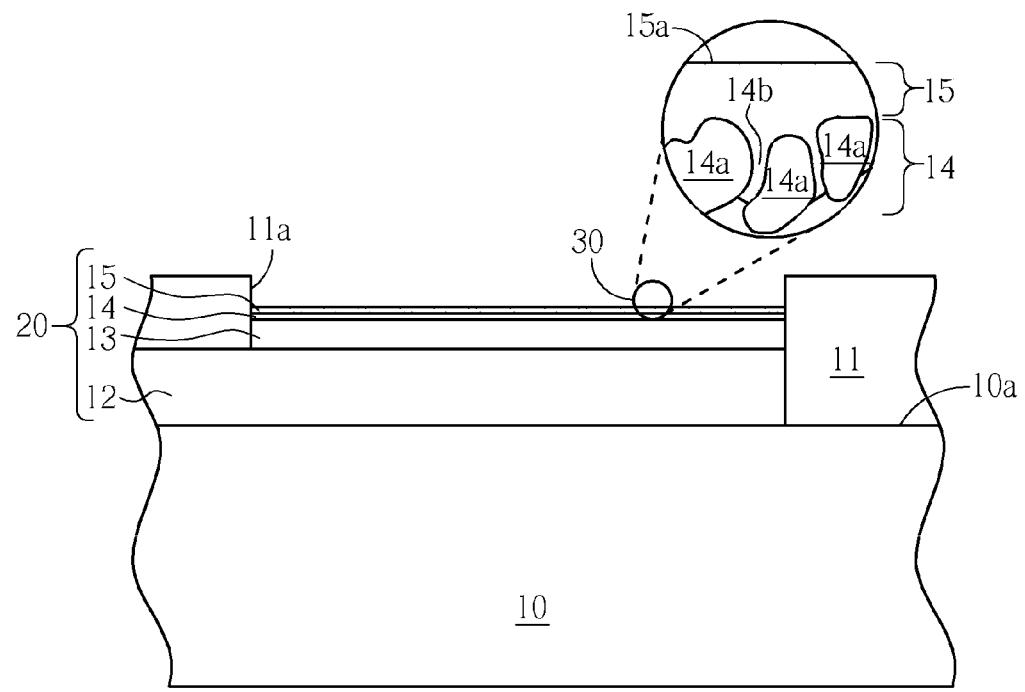
FIG. 1 is a schematic, cross-sectional diagram showing a pad structure in accordance with one preferred embodiment of this invention.

In the following description, numerous specific details are given to provide a thorough understanding of the invention. However, it will be apparent to one skilled in the art that the invention may be practiced without these specific details. In order to avoid obscuring the present invention, some well-known system configurations and process steps are not disclosed in detail.

Likewise, the drawings showing embodiments of the devices are semi-diagrammatic and not to scale and, particularly, some of the dimensions are for the clarity of presentation and are shown exaggerated in the FIGS. Also, where multiple embodiments are disclosed and described having some features in common, for clarity and ease of illustration and description thereof like or similar features one to another will ordinarily be described with like reference numerals.

The term "pad" or "pad structure" as used herein is defined as a contact pad or a bond pad, regardless of its purpose of use. The bond pad may be a wire-bond finger or a solder bond pad (or solder pad), while the contact pad may be a gold finger on any substrate for electrical contact, for example, a contact finger on a dynamic random access memory (DRAM) device or an input/output (I/O) pad on an integrated circuit (IC) chip.

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

FIG. 1 is a schematic, cross-sectional diagram showing a pad structure in accordance with one preferred embodiment of this invention. As shown in FIG. 1, the pad structure 20 is formed on a surface 10a of a substrate 10. The substrate 10 may be printed circuit board (PCB) substrates, IC carrier substrates or package substrates. According to the invention, the pad structure 20 may be a bond pad structure or a contact pad structure, wherein the aforesaid bond pad structure may be a wire-bond finger or a solder bond pad, while the contact pad structure may be a contact gold finger on a substrate, for example, a contact finger on a dynamic random access memory (DRAM) device or an input/output (I/O) pad on an integrated circuit (IC) chip. For the sake of simplicity, the interconnection structure in the substrate 10 is not demonstrated. Further, it is to be understood that the aforesaid substrate 10 may be a single-sided wiring board, a double-sided wiring board or a multi-layer wiring board.

According to the preferred embodiment of this invention, a solder mask 11 covers the surface 10a of the substrate 10. The solder mask 11 protects the copper trace pattern 12 formed on the surface 10a of the substrate 10. A solder opening 11a is formed in the solder mask 11 and the solder opening 11a exposes a portion of the underlying copper trace pattern 12. The solder opening 11a defines the position of electrical contact for wire bonding such as wire-bond finger or electrical contact for solder ball placement such as solder bond pad. The circuit board or the substrate is electrically connected with a chip through the electrical contact. The aforesaid solder opening 11a may be formed by conventional exposure and development processes or by laser ablation, but not limited thereto.

According to the preferred embodiment of this invention, on the exposed portion of the copper trace pattern 12 within the solder opening 11a, a chemically plated nickel layer 13, a gold layer 14 and a nano-structured coating film 15 are provided. The aforesaid gold layer 14 may be formed by electroplating or chemical plating methods. According to the preferred embodiment of this invention, when the aforesaid gold layer 14 is formed by chemical plating method, the thickness of the gold layer 14 is not greater than 0.15 µm, preferably 0.1 µm for example. According to the preferred embodiment of this invention, when the aforesaid gold layer 14 is formed by electroplating method, the thickness of the gold layer 14 is not greater than 0.3 µm, preferably 0.2 µm for example.

The aforesaid gold layer 14 may be formed by chemical plating method or by any suitable plating method, which should not be limiting to the scope of this invention. One of the major features of this invention is that the aforesaid gold layer 14 is much thinner, for example, only about 0.1 µm or even thinner, compared to the minimum requirement of thickness of the gold layer according to the prior art. The manufacturing cost is thus significantly reduced compared either to conventional electroplating method or chemical plating method. Further, in other embodiments, the aforesaid gold layer 14 may be other metals, for example, silver layer. It is another feature of this invention that the aforesaid nano-structured coating film 15 has good bondability either to a gold layer or to a silver layer.

According to the preferred embodiment of this invention, the aforesaid nano-structured coating film 15 is a conductive film and has good bondability to the gold layer 14. The nano-structured coating film 15 infiltrates the grain boundary 14b of the surface grains 14a of the gold layer 14 to thereby form dense and smooth nano-structured coating surface 15a, as shown in the circle 30 of FIG. 1. By doing so, the outer corrosive substances are not able to contact the underlying chemically plated nickel layer 13 and the resistance to corrosion or acid of the pad structure 20 is greatly improved. Accordingly, even the nickel and gold layers are formed by chemical plating methods, the invention pad structure 20 can still be employed in the technical fields of wire bonding or flip chip packaging. Further, the dense and smooth surface 15a of the nano-structured coating film 15 keeps the pad surface from dust or contaminants and the pad surface stays at high degree of cleanliness at all time. Since micro-particles or contaminants are difficult to stick or absorb onto the dense and smooth surface 15a of the nano-structured coating film 15, a subsequent plasma cleaning process prior to the wire bonding process may be omitted for the pad structure 20.

Further, in accordance with the preferred embodiment of this invention, the aforesaid nano-structured coating film 15 provides high surface hardness, for example, 3 H-6 H (measured by Mitsubishi pencil hardness tester at 750 g load), preferably 4 H-5 H. Therefore, the invention can provide improved surface wear-resistance of the pad structure 20.

In accordance with the preferred embodiment of this invention, the aforesaid nano-structured coating film 15 may be made of conductive polymeric materials such as polypyrrole, polyparaphenylene, polythiophene, polyaniline, or derivatives or combinations thereof. Of course, the aforesaid nano-structured coating film 15 is not limited to the above-described polymeric materials and may be made of other surface nano-structured coating materials with high hardness and conductivity, for example, nano-structured carbon, nano-structured metal or nano-structured conductive plastic. According to the preferred embodiment of this invention, the aforesaid nano-structured coating film 15 has a thickness of about 2 nm to about 20 nm.

Figure 2:
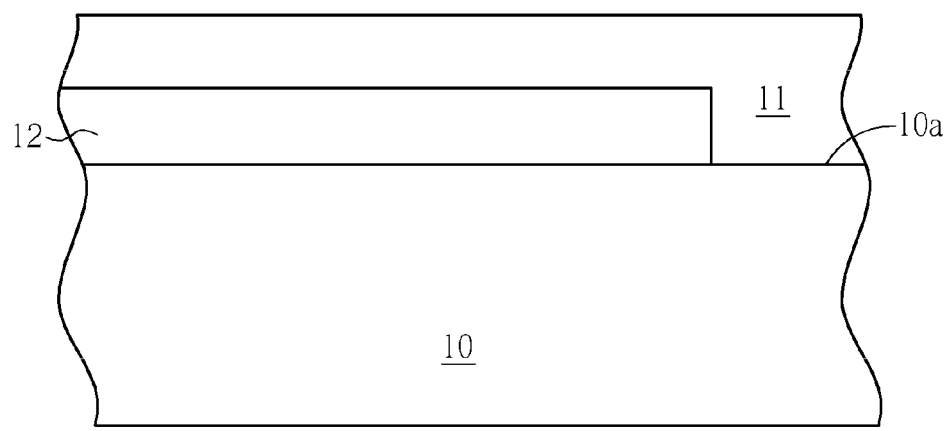
FIGS. 2-5 are schematic, cross-sectional diagrams showing a method for manufacturing a pad structure in accordance with the preferred embodiment of this invention.

FIGS. 2-5 are schematic, cross-sectional diagrams showing a method for manufacturing a pad structure in accordance with the preferred embodiment of this invention. As shown in FIG. 2, a substrate 10 such as a PCB substrate, IC carrier substrate or any other suitable package substrate is provided. For the sake of simplicity, the interconnection structure in the substrate 10 is not illustrated. It is to be understood that the aforesaid substrate 10 may be a single-sided wiring board, a double-sided wiring board or a multi-layer wiring board. A copper trace pattern 12 is formed on the surface 10a of the substrate 10. Subsequently, the surface 10a of the substrate 10 is covered with a solder mask 11 for protecting the copper trace pattern 12.

Figure 3:
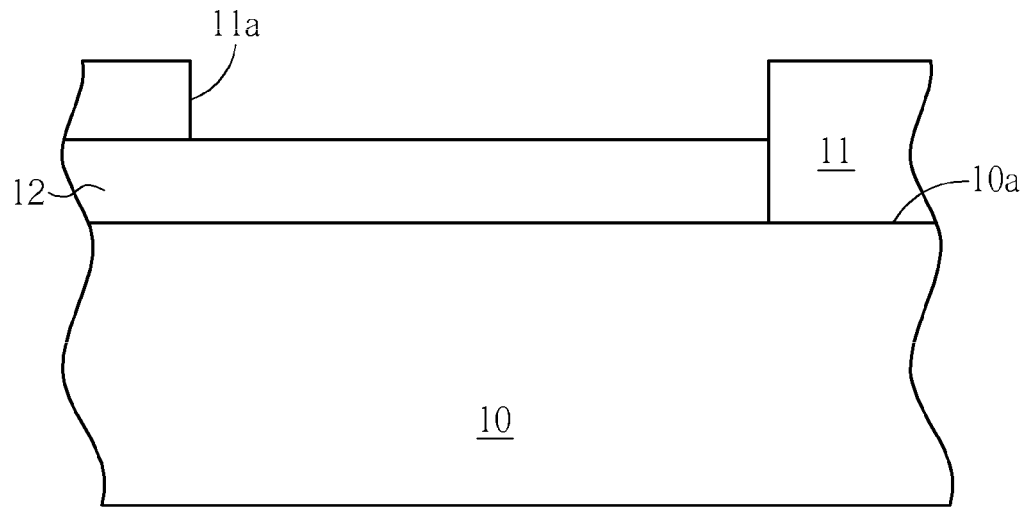

As shown in FIG. 3, a solder opening 11a is formed in the solder mask 11 to expose a portion of the copper trace pattern 12. The solder opening 11a defines the position of electrical contact for wire bonding such as wire-bond finger or electrical contact for solder ball placement such as solder bond pad. The circuit board or the substrate is electrically connected with a chip through the electrical contact. The aforesaid solder opening 11a may be formed by conventional lithographic process including but not limited to exposure and development, or by laser ablation, but not limited thereto.

Figure 4:
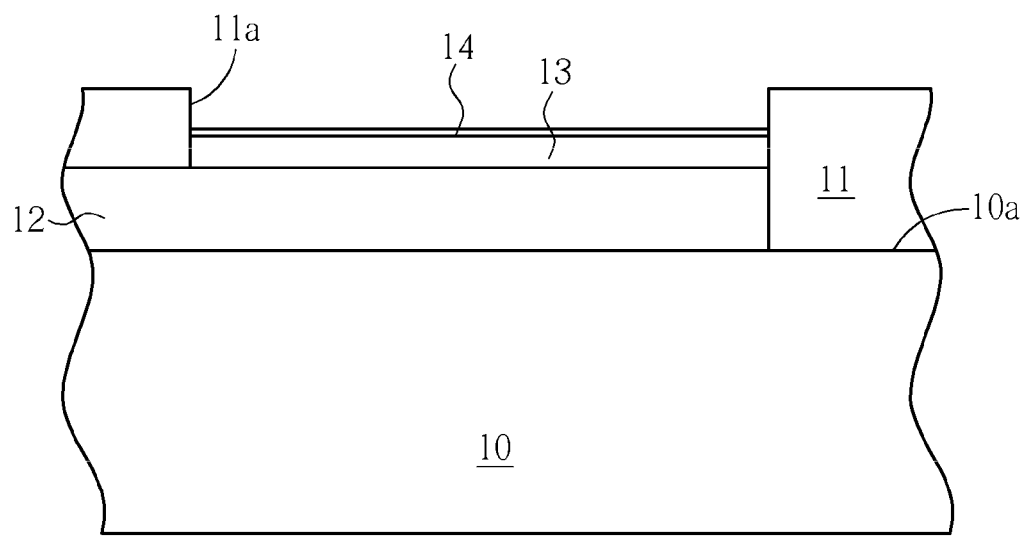

As shown in FIG. 4, after the formation of the solder opening 11a, a nickel layer 13 is formed on the exposed portion of the copper trace pattern 12 within the solder opening 11a, and a gold layer 14 is then formed on the nickel layer 13. The aforesaid gold layer 14 may be formed by electroplating or chemical plating methods. According to the preferred embodiment of this invention, when the aforesaid gold layer 14 is formed by chemical plating method, the thickness of the gold layer 14 is not greater than 0.15 µm, preferably 0.1 µm for example. According to the preferred embodiment of this invention, when the aforesaid gold layer 14 is formed by electroplating method, the thickness of the gold layer 14 is not greater than 0.3 µm, preferably 0.2 µm for example.

Figure 5:
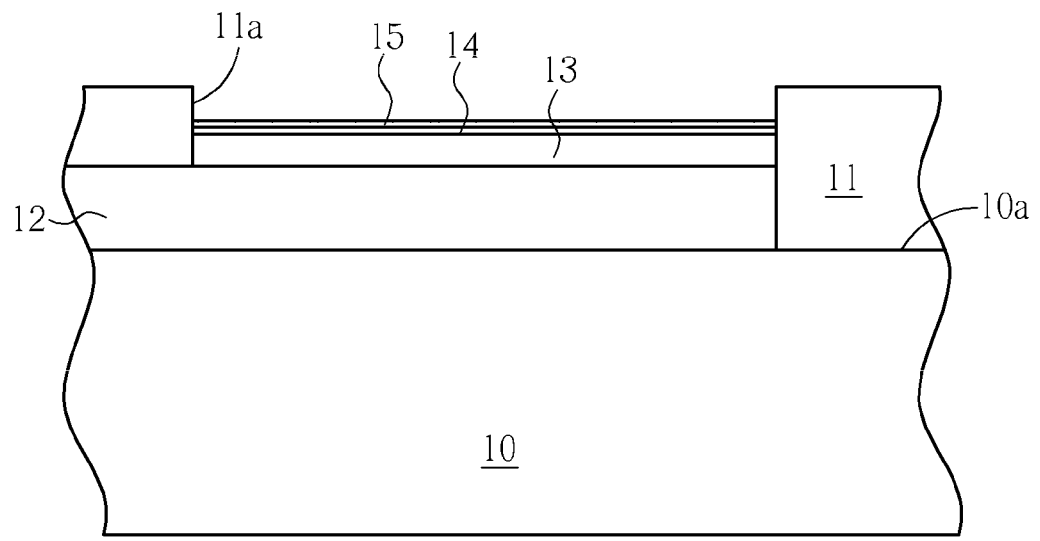

As shown in FIG. 5, a chemical deposition process is carried out to form a gold layer 14 selectively on the nano-structured coating film 15. The nano-structured coating film 15 only deposits on the gold layer and has high selectivity. The nano-structured coating film 15 does not deposit on the solder mask 11 substantially. According to the preferred embodiment of this invention, the aforesaid nano-structured coating film 15 is a conductive film and has good bondability to the gold layer 14. The nano-structured coating film 15 infiltrates the grain boundary of the surface grains of the gold layer 14. The outer corrosive substances are not able to contact the underlying chemically plated nickel layer 13 and the resistance to corrosion or acid of the pad structure 20 is greatly improved. In accordance with the preferred embodiment of this invention, the aforesaid nano-structured coating film 15 provides high surface hardness, for example, 3 H-6 H (measured by Mitsubishi pencil hardness tester at 750 g load), preferably 4 H-5 H. Therefore, the invention can provide improved surface wear-resistance of the pad structure 20.

In accordance with the preferred embodiment of this invention, the aforesaid nano-structured coating film 15 may be made of conductive polymeric materials such as polypyrrole, polyparaphenylene, polythiophene, polyaniline, or derivatives or combinations thereof. Of course, the aforesaid nano-structured coating film 15 is not limited to the above-described polymeric materials and may be made of other surface nano-structured coating materials with high hardness and conductivity, for example, nano-structured carbon, nano-structured metal or nano-structured conductive plastic. According to the preferred embodiment of this invention, the aforesaid nano-structured coating film 15 has a thickness of about 2 nm to about 20 nm.

Figure 6:
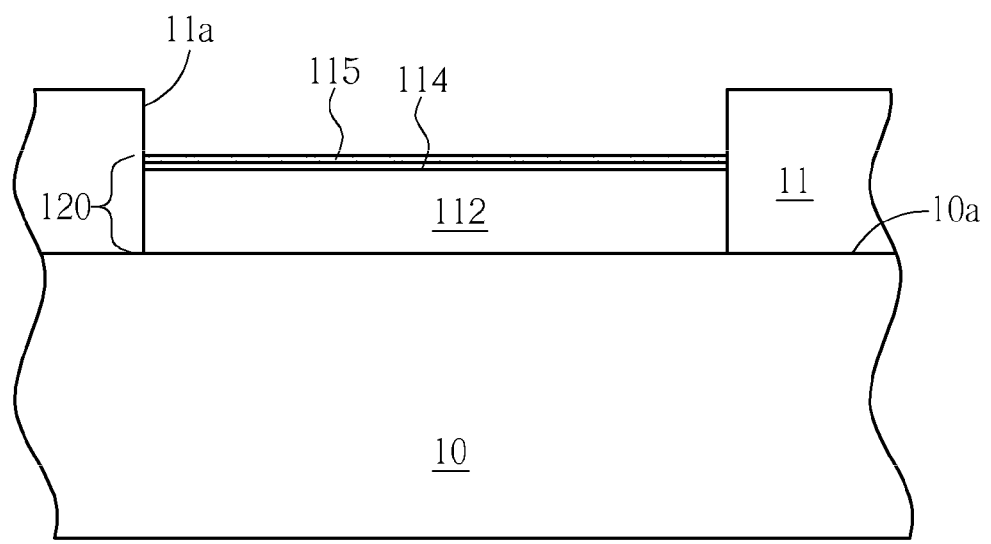
FIG. 6 is a schematic, cross-sectional diagram showing a pad structure in accordance with another preferred embodiment of this invention.

FIG. 6 is a schematic, cross-sectional diagram showing a pad structure in accordance with another preferred embodiment of this invention. As shown in FIG. 6, the pad structure 120 is formed on a surface 10a of a substrate 10. The substrate 10 may be printed circuit board (PCB) substrates, IC carrier substrates or package substrates. For the sake of simplicity, the interconnection structure in the substrate 10 is not demonstrated. Further, it is to be understood that the aforesaid substrate 10 may be a single-sided wiring board, a double-sided wiring board or a multi-layer wiring board.

A copper trace pattern 112 is formed on the surface 10a of the substrate 10. The surface 10a of the substrate 10 is covered with a solder mask 11 for protecting the copper trace pattern 112. A solder opening 11a is formed in the solder mask 11 to expose a portion of the copper trace pattern 112. The solder opening 11a defines the position of electrical contact for wire bonding such as wire-bond finger or electrical contact for solder ball placement such as solder bond pad. The circuit board or the substrate is electrically connected with a chip through the electrical contact. The aforesaid solder opening 11a may be formed by conventional lithographic process including but not limited to exposure and development, or by laser ablation, but not limited thereto.

According to this preferred embodiment, on the exposed portion of the copper trace pattern 112 within the solder opening 11a, a gold layer 114 and a nano-structured coating film 115 are provided. The aforesaid gold layer 114 may be formed by electroplating or chemical plating methods. According to this preferred embodiment, when the aforesaid gold layer 114 is formed by chemical plating method, the thickness of the gold layer 114 is not greater than 0.15 µm, preferably 0.1 µm for example. According to this preferred embodiment, when the aforesaid gold layer 114 is formed by electroplating method, the thickness of the gold layer 114 is not greater than 0.3 µm, preferably 0.2 µm for example.

The aforesaid gold layer 114 may be formed by chemical plating method or by any suitable plating method, which should not be limiting to the scope of this invention. One of the major features of this invention is that the aforesaid gold layer 114 is much thinner, for example, only about 0.1 µm or even thinner, compared to the minimum requirement of thickness of the gold layer according to the prior art. The manufacturing cost is thus significantly reduced compared either to conventional electroplating method or chemical plating method.

In accordance with this preferred embodiment, the aforesaid nano-structured coating film 115 is a conductive film and has good bondability to the gold layer 114. Further, the aforesaid nano-structured coating film 115 provides high surface hardness, for example, 3 H-6 H (measured by Mitsubishi pencil hardness tester at 750 g load), preferably 4 H-5 H. Therefore, the invention can provide improved surface wear-resistance of the pad structure 120.

In accordance with the preferred embodiment of this invention, the aforesaid nano-structured coating film 115 may be made of conductive polymeric materials such as polypyrrole, polyparaphenylene, polythiophene, polyaniline, or derivatives or combinations thereof. Of course, the aforesaid nano-structured coating film 115 is not limited to the above-described polymeric materials and may be made of other surface nano-structured coating materials with high hardness and conductivity, for example, nano-structured carbon, nano-structured metal or nano-structured conductive plastic. According to the preferred embodiment of this invention, the aforesaid nano-structured coating film 115 has a thickness of about 2 nm to about 20 nm.

Figure 7:
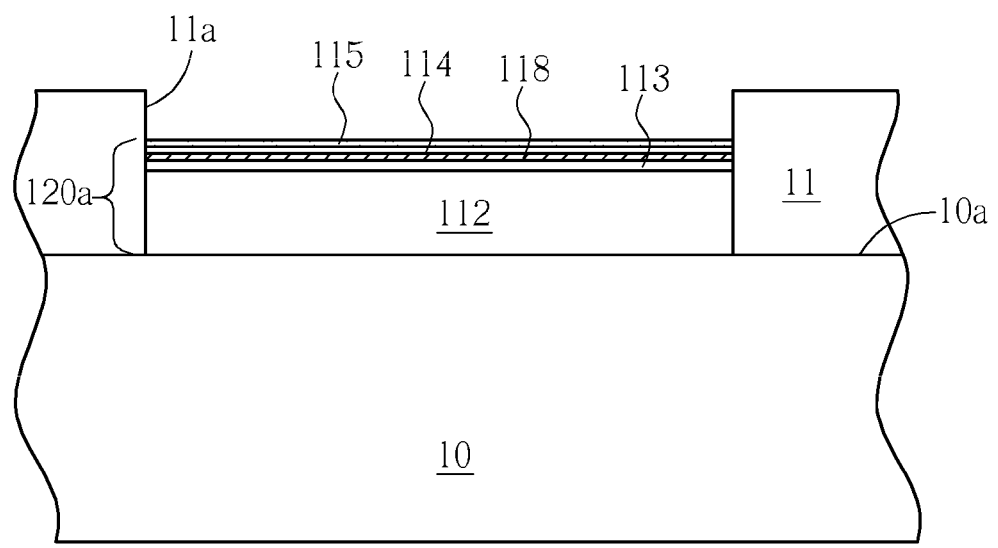
FIG. 7 is a schematic, cross-sectional diagram showing a pad structure in accordance with yet another preferred embodiment of this invention.

FIG. 7 is a schematic, cross-sectional diagram showing a pad structure in accordance with yet another preferred embodiment of this invention. As shown in FIG. 7, the pad structure 120a is formed on a surface 10a of a substrate 10. The substrate 10 may be printed circuit board (PCB) substrates, IC carrier substrates or package substrates. For the sake of simplicity, the interconnection structure in the substrate 10 is not demonstrated. Further, it is to be understood that the aforesaid substrate 10 may be a single-sided wiring board, a double-sided wiring board or a multi-layer wiring board.

A copper trace pattern 112 is formed on the surface 10a of the substrate 10. The surface 10a of the substrate 10 is covered with a solder mask 11 for protecting the copper trace pattern 112. A solder opening 11a is formed in the solder mask 11 to expose a portion of the copper trace pattern 112. The solder opening 11a defines the position of electrical contact for wire bonding such as wire-bond finger or electrical contact for solder ball placement such as solder bond pad. The circuit board or the substrate is electrically connected with a chip through the electrical contact. The aforesaid solder opening 11a may be formed by conventional lithographic process including but not limited to exposure and development, or by laser ablation, but not limited thereto.

According to this preferred embodiment, on the exposed portion of the copper trace pattern 112 within the solder opening 11a, a nickel layer 113, a palladium layer 118, a gold layer 114 and a nano-structured coating film 115 are provided. The aforesaid gold layer 114 may be formed by electroplating or chemical plating methods. According to this preferred embodiment, when the aforesaid gold layer 114 is formed by chemical plating method, the thickness of the gold layer 114 is not greater than 0.15 μm, preferably 0.1 μm for example. According to this preferred embodiment, when the aforesaid gold layer 114 is formed by electroplating method, the thickness of the gold layer 114 is not greater than 0.3 μm, preferably 0.2 μm for example.

The aforesaid nickel layer 113 or palladium layer 118 may be formed by chemical plating method or by any suitable plating method, while the aforesaid gold layer 114 may be formed by chemical plating or electroplating methods or by any suitable plating method, which should not be limiting to the scope of this invention. One of the major features of this invention is that the aforesaid gold layer 114 is much thinner, for example, only about 0.1 μm or even thinner, compared to the minimum requirement of thickness of the gold layer according to the prior art. The manufacturing cost is thus significantly reduced compared either to conventional electroplating method or chemical plating method.

In accordance with this preferred embodiment, the aforesaid nano-structured coating film 115 is a conductive film and has good bondability to the gold layer 114. Further, the aforesaid nano-structured coating film 115 provides high surface hardness, for example, 3 H (measured by Mitsubishi pencil hardness tester at 750 g load), preferably 6 H. Therefore, the invention can provide improved surface wear-resistance of the pad structure 120a.

In accordance with the preferred embodiment of this invention, the aforesaid nano-structured coating film 115 may be made of conductive polymeric materials such as polypyrrole, polyparaphenylene, polythiophene, polyaniline, or derivatives or combinations thereof. Of course, the aforesaid nano-structured coating film 115 is not limited to the above-described polymeric materials and may be made of other surface nano-structured coating materials with high hardness and conductivity, for example, nano-structured carbon, nano-structured metal or nano-structured conductive plastic. According to the preferred embodiment of this invention, the aforesaid nano-structured coating film 115 has a thickness of about 2 nm to about 20 nm.

Figure 8:
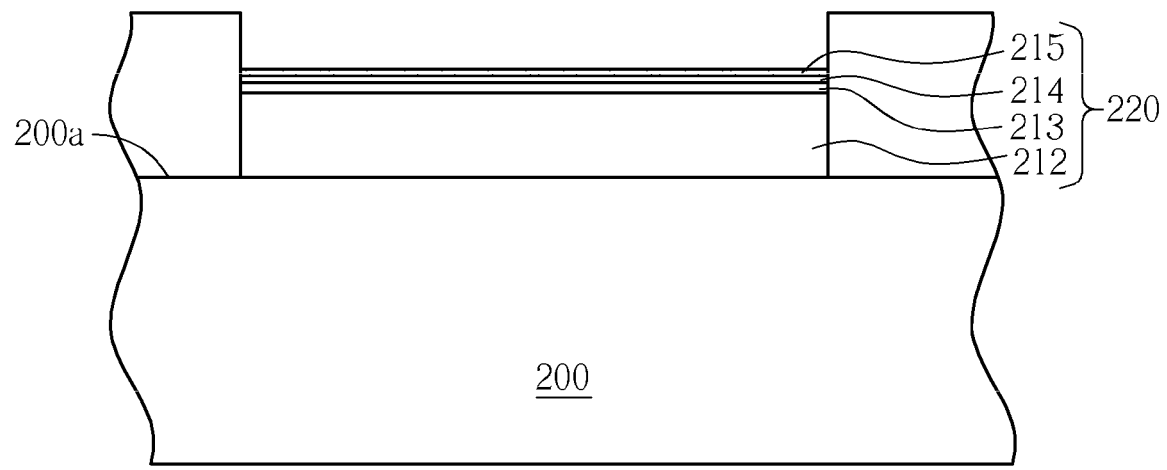
FIG. 8 is a schematic, cross-sectional diagram showing a pad structure in accordance with still another preferred embodiment of this invention.

FIG. 8 is a schematic, cross-sectional diagram showing a pad structure in accordance with still another preferred embodiment of this invention. As shown in FIG. 8, the pad structure 220 is formed on a surface 200a of a substrate 200. The substrate 200 may be a light-emitting diode (LED) package substrate. The pad structure 220 comprises a copper trace pattern 212, a nickel layer 213, a silver layer 214 and a nano-structured coating film 215. The aforesaid silver layer 214 may be formed by electroplating or chemical plating methods. According to this embodiment, the aforesaid silver layer 214 has a thickness of less than 2 um, preferably 1 um or even thinner.

In accordance with this preferred embodiment, the aforesaid nano-structured coating film 215 is a conductive film and has good bondability to the silver layer 214. Likewise, the nano-structured coating film 215 infiltrates the grain boundary of the surface grains of the silver layer 214 to thereby form dense and smooth nano-structured coating surface. By doing so, the outer corrosive substances are not able to contact the underlying chemically plated nickel layer 213 and the resistance to corrosion or acid of the pad structure 220 is greatly improved. The nano-structured coating film 215 can significantly increase the light reflectivity of the LED package substrate and therefore the light utilization efficiency. Furthermore, the nano-structured coating film 215 can significantly prolong the life of the silver layer 214 beyond the expiration period and prevent the silver layer 214 from blackening.

In accordance with this preferred embodiment, the aforesaid nano-structured coating film 215 provides high surface hardness, for example, 3 H-6 H (measured by Mitsubishi pencil hardness tester at 750 g load), preferably 4 H-5 H. Therefore, the invention can provide improved surface wear-resistance of the pad structure 220.

In accordance with the preferred embodiment of this invention, the aforesaid nano-structured coating film 215 may be made of conductive polymeric materials such as polypyrrole, polyparaphenylene, polythiophene, polyaniline, or derivatives or combinations thereof. Of course, the aforesaid nano-structured coating film 215 is not limited to the above-described polymeric materials and may be made of other surface nano-structured coating materials with high hardness and conductivity, for example, nano-structured carbon, nano-structured metal or nano-structured conductive plastic. According to the preferred embodiment of this invention, the aforesaid nano-structured coating film 215 has a thickness of about 2 nm to about 20 nm.

Figure 9:
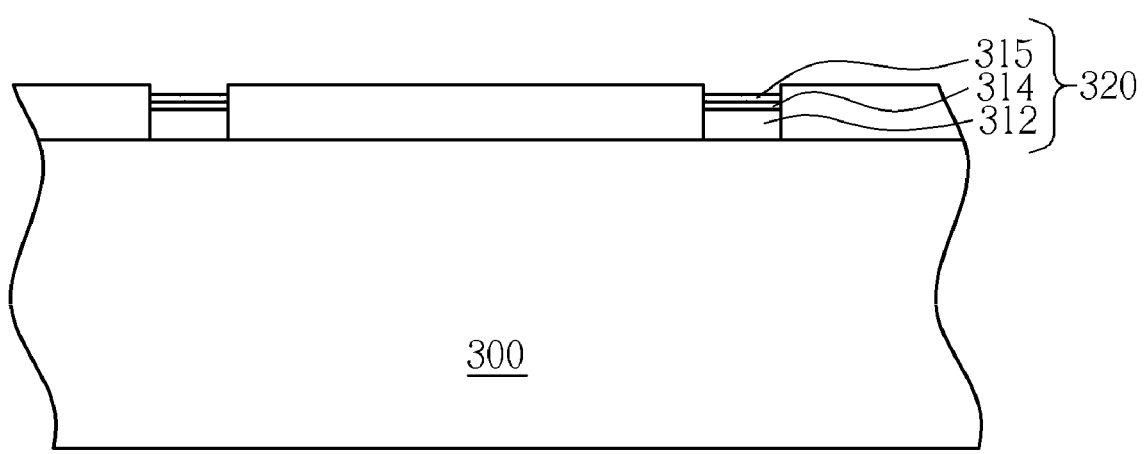
FIG. 9 is a schematic, cross-sectional diagram showing a pad structure in accordance with still another preferred embodiment of this invention.

FIG. 9 is a schematic, cross-sectional diagram showing a pad structure in accordance with still another preferred embodiment of this invention. As shown in FIG. 9, the pad structure 320 is formed on an integrated circuit chip 300. The substrate 300 comprises a lower copper trace pattern 312, a surface metal layer 314 and a nano-structured coating film 315. The aforesaid surface metal layer 314 may be an under bump metallurgy (UBM) layer such as gold layer or Ni/Au layer, but not limited thereto. The nano-structured coating film 315 provides good bondability to the metal of the surface metal layer 314 and provides a nano-structured coating surface with improved resistance to grinding, scratching or corrosion.

In accordance with this preferred embodiment, the aforesaid nano-structured coating film 315 provides high surface hardness, for example, 3 H-6 H (measured by Mitsubishi pencil hardness tester at 750 g load), preferably 4 H-5 H. Therefore, the invention can provide improved surface wear-resistance of the pad structure 320.

In accordance with the preferred embodiment of this invention, the aforesaid nano-structured coating film 315 may be made of conductive polymeric materials such as polypyrrole, polyparaphenylene, polythiophene, polyaniline, or derivatives or combinations thereof. Of course, the aforesaid nano-structured coating film 315 is not limited to the above-described polymeric materials and may be made of other surface nano-structured coating materials with high hardness and conductivity, for example, nano-structured carbon, nano-structured metal or nano-structured conductive plastic. According to the preferred embodiment of this invention, the aforesaid nano-structured coating film 315 has a thickness of about 2 nm to about 20 nm.

Those skilled in the art will readily observe that numerous modifications and alterations of the device and method may be made while retaining the teachings of the invention.

What is claimed is:

1. A pad structure, comprising:
   a copper trace pattern on a substrate;
   a nickel layer stacked on the copper trace pattern;
   a gold layer stacked on the nickel layer; and
   a nano-structured coating film stacked on the gold layer, wherein the nano-structured coating film infiltrates surface grain boundary of the gold layer.

2. The pad structure according to claim 1 wherein the nano-structured coating film is a conductive film.

3. The pad structure according to claim 1 wherein the nano-structured coating film has a surface hardness of 3H-6H (measured by Mitsubishi pencil hardness tester at 750 g load).

4. The pad structure according to claim 3 wherein the nano-structured coating film has a surface hardness of 4H-5H (measured by Mitsubishi pencil hardness tester at 750 g load).

5. The pad structure according to claim 1 wherein the nano-structured coating film has a thickness of about 2 nm to about 20 nm.

6. The pad structure according to claim 1 wherein the nano-structured coating film comprises polypyrrole, polyparaphenylene, polythiophene, polyaniline, nano-structured carbon, nano-structured metal or nano-structured conductive plastic.

7. The pad structure according to claim 1 wherein the gold layer is chemically plated gold and has a thickness of less than 0.15 μm.

8. The pad structure according to claim 1 wherein the gold layer is electroplated gold and has a thickness of less than 0.3 um.

9. The pad structure according to claim 1 wherein a palladium layer is disposed between the nickel layer and the gold layer.

10. The pad structure according to claim 1 wherein the substrate comprises printed circuit board substrates, IC carried substrates or package substrates.

11. A pad structure, comprising:
    a copper trace pattern on a substrate;
    a gold layer stacked on the copper trace pattern; and
    a nano-structured coating film stacked on the gold layer, wherein the nano-structured coating film infiltrates surface grain boundary of the gold layer.

12. The pad structure according to claim 11 wherein the nano-structured coating film is a conductive film.

13. The pad structure according to claim 11 wherein the nano-structured coating film has a surface hardness of 3H-6H (measured by Mitsubishi pencil hardness tester at 750 g load).

14. The pad structure according to claim 13 wherein the nano-structured coating film has a surface hardness of 4H-5H (measured by Mitsubishi pencil hardness tester at 750 g load).

15. The pad structure according to claim 11 wherein the nano-structured coating film has a thickness of about 2 nm to about 20 nm.

16. The pad structure according to claim 11 wherein the nano-structured coating film comprises polypyrrole, polyparaphenylene, polythiophene, polyaniline, nano-structured carbon, nano-structured metal or nano-structured conductive plastic.

17. The pad structure according to claim 11 wherein the gold layer is chemically plated gold and has a thickness of less than 0.15 μm.

18. The pad structure according to claim 11 wherein the gold layer is electroplated gold and has a thickness of less than 0.3 um.

19. The pad structure according to claim 11 wherein the substrate comprises printed circuit board substrates, IC carried substrates or package substrates.

20. A pad structure, comprising:
    a copper trace pattern on a substrate;
    a nickel layer stacked on the copper trace pattern;
    a silver layer stacked on the nickel layer; and
    a nano-structured coating film stacked on the silver layer, wherein the nano-structured coating film infiltrates surface grain boundary of the silver layer.

21. The pad structure according to claim 20 wherein the nano-structured coating film is a conductive film.

22. The pad structure according to claim 20 wherein the substrate is a light-emitting diode (LED) package substrate.

23. The pad structure according to claim 20 wherein the nano-structured coating film has a surface hardness of 3H-6H (measured by Mitsubishi pencil hardness tester at 750 g load).

24. The pad structure according to claim 23 wherein the nano-structured coating film has a surface hardness of 4H-5H (measured by Mitsubishi pencil hardness tester at 750 g load).

25. The pad structure according to claim 20 wherein the nano-structured coating film has a thickness of about 2 nm to about 20 nm.

26. The pad structure according to claim 20 wherein the nano-structured coating film comprises polypyrrole, polyparaphenylene, polythiophenpolyaniline, nano-structured carbon, nano-structured metal or nano-structured conductive plastic.

27. The pad structure according to claim 20 wherein the silver layer has a thickness of less than 2 um.

* * * * *